(12) United States Patent
Xiao et al.

(10) Patent No.: US 12,014,014 B2
(45) Date of Patent: Jun. 18, 2024

(54) TOUCH DISPLAY SUBSTRATE AND TOUCH DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yunsheng Xiao, Beijing (CN); Xiangdan Dong, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 332 days.

(21) Appl. No.: 17/422,235

(22) PCT Filed: Feb. 12, 2020

(86) PCT No.: PCT/CN2020/074843
§ 371 (c)(1),
(2) Date: Jul. 12, 2021

(87) PCT Pub. No.: WO2021/159299
PCT Pub. Date: Aug. 19, 2021

(65) Prior Publication Data
US 2022/0342509 A1 Oct. 27, 2022

(51) Int. Cl.
*G09G 5/00* (2006.01)
*G06F 3/044* (2006.01)
*H10K 59/40* (2023.01)

(52) U.S. Cl.
CPC .......... *G06F 3/0446* (2019.05); *G06F 3/0445* (2019.05); *H10K 59/40* (2023.02);
(Continued)

(58) Field of Classification Search
CPC ................ G06F 3/0446; G06F 3/0445; G06F 2203/04102; G06F 2203/04107;
(Continued)

(56) References Cited

U.S. PATENT DOCUMENTS

2017/0154566 A1\* 6/2017 Ryoo ................... G09G 3/3648
2019/0074328 A1 3/2019 Park
(Continued)

FOREIGN PATENT DOCUMENTS

CN 108735094 A 11/2018
CN 108873512 A 11/2018
(Continued)

*Primary Examiner* — Jennifer T Nguyen
(74) *Attorney, Agent, or Firm* — The Webb Law Firm (57) ABSTRACT

The present disclosure provides a touch display substrate and a touch display device. The touch display substrate has an opening, and includes a base, a display layer located on one side of the base substrate and a touch layer located on one side of the display layer away from the base. The touch layer includes a network of intersecting plurality of touch wires, which include: a first touch wire extending in a first direction and including a plurality of first touch electrodes arranged in the first direction and first connection portions connecting adjacent first touch electrodes; and a second touch wire extending in a second direction and including a plurality of second touch electrodes arranged in the second direction and second connection portions connecting adjacent second touch electrodes, the second connection portions and the first connection portions being insulated from and intersecting with one another.

17 Claims, 7 Drawing Sheets

(52) U.S. Cl.
CPC .............. *G06F 2203/04102* (2013.01); *G06F 2203/04107* (2013.01); *G06F 2203/04111* (2013.01); *G06F 2203/04112* (2013.01)

(58) Field of Classification Search
CPC . G06F 2203/04111; G06F 2203/04112; H10K 59/40
USPC ........................................................ 345/173
See application file for complete search history.

(56) References Cited

U.S. PATENT DOCUMENTS

| | | | |
|---|---|---|---|
| 2019/0285954 A1* | 9/2019 | Yoshida | G06F 3/04164 |
| 2019/0294278 A1 | 9/2019 | Kim et al. | |
| 2020/0110298 A1 | 4/2020 | Li et al. | |
| 2020/0142525 A1* | 5/2020 | Han | H10K 59/40 |
| 2020/0225784 A1 | 7/2020 | Hwangbo et al. | |
| 2020/0328257 A1* | 10/2020 | Kim | H10K 59/40 |

FOREIGN PATENT DOCUMENTS

| | | |
|---|---|---|
| CN | 109460167 A | 3/2019 |
| CN | 109545085 A | 3/2019 |
| CN | 109856840 A | 6/2019 |
| EP | 2765490 A1 | 8/2014 |
| EP | 2846236 A2 | 3/2015 |
| EP | 3176680 A1 | 6/2017 |
| EP | 3428783 A1 | 1/2019 |
| EP | 3575935 A1 | 12/2019 |
| EP | 3598278 A1 | 1/2020 |
| EP | 3660917 A1 | 6/2020 |
| EP | 3745241 A2 | 12/2020 |
| EP | 3783465 A1 | 2/2021 |
| EP | 3828675 A1 | 6/2021 |
| WO | 2019050209 A1 | 3/2019 |

* cited by examiner

TOUCH DISPLAY SUBSTRATE AND TOUCH DISPLAY DEVICE

CROSS-REFERENCE TO RELATED APPLICATION

This application is the United States national phase of International Application No. PCT/CN2020/074843 filed Feb. 12, 2020, the disclosure of which is hereby incorporated by reference in its entirety.

TECHNICAL FIELD

The present disclosure relates to the field of touch display technologies, and particularly, to a touch display substrate and a touch display device.

BACKGROUND

With the development of science and technology, more and more diverse functions are required for a touch display device, and its front panel, except for a screen, is generally provided with functional modules such as a camera and a distance sensor. As for a touch display device in the related art, in order to seek for a higher screen occupation ratio, the camera and the distance sensor are arranged in a display area of the screen, and correspondingly, a touch display substrate of the touch display device is provided with an opening for avoiding collision with the camera and the distance sensor.

How to improve touch sensitivity of the touch display device around the opening is a technical problem to be solved urgently at present.

SUMMARY

According to an aspect of the embodiments of the present disclosure, there is provided a touch display substrate, the touch display substrate having an opening, the touch display substrate comprising:

a base substrate;

a display layer located on one side of the base substrate; and a touch layer located on one side of the display layer away from the base substrate, the touch layer comprising a plurality of touch wires in a network form, which are insulated from and intersecting with one another, the plurality of touch wires comprising:

a first touch wire extending in a first direction, the first touch wire comprising a plurality of first touch electrodes arranged in the first direction and a first connection portion connecting adjacent ones of the first touch electrodes; and a second touch wire extending in a second direction, the second touch wire comprising a plurality of second touch electrodes arranged in the second direction and a second connection portion connecting adjacent ones of the second touch electrodes, the second connection portion and the first connection portion being insulated from and intersecting with one another, wherein at least one of the touch wires comprises two wire segments separated by the opening, and at least one bridging wire connecting the two wire segments, the bridging wire comprising a winding portion arranged around an edge of the opening and two lead portions located at both ends of the winding portion.

In some embodiments, the bridging wires connecting the two of the wire segments are at least two and distributed on both sides of the opening.

In some embodiments, at least one of the first touch wires comprises: two first wire segments separated by the opening, and at least one first bridging wire connecting the two first wire segments, the first bridging wire comprising a first winding portion arranged around the edge of the opening and two first lead portions located at both ends of the first winding portion; and at least one of the second touch wires comprises: two second wire segments separated by the opening, and at least one second bridging wire connecting the two second wire segments, the second bridging wire comprising a second winding portion arranged around the edge of the opening and two second lead portions located at both ends of the second winding portion, wherein the second winding portion is located on one side of the first winding portion away from the opening.

In some embodiments, the touch layer further comprises: a first shielding ring and a second shielding ring which are arranged in sequence in a direction away from the opening and are insulated from the first bridging wire and the second bridging wire; and the first winding portion is located on one side of the first shielding ring away from the second shielding ring, and the second winding portion is located between the first shielding ring and the second shielding ring.

In some embodiments, the touch layer further comprises: a third shielding ring located on one side of the first shielding ring close to the opening and insulated from the first bridging wire and the second bridging wire; and the first winding portion is located between the third shielding ring and the first shielding ring.

In some embodiments, the touch layer further comprises: the third shielding ring and the first shielding ring which are arranged in sequence in the direction away from the opening and are insulated from the first bridging wire and the second bridging wire; and the first winding portion is located between the third shielding ring and the first shielding ring, and the second winding portion is located on one side of the first shielding ring away from the third shielding ring.

In some embodiments, the touch layer comprises a first conductive pattern layer, a second conductive pattern layer, and an insulating pattern layer located between the first conductive pattern layer and the second conductive pattern layer; the first touch electrode, the second touch electrode, the first connection portion, the first lead portion and the second lead portion are located on the first conductive pattern layer; the second connection portion is located on the second conductive pattern layer; the first winding portion, the second winding portion, the first shielding ring and the second shielding ring separately have a double-layer structure separated by the insulating pattern layer, and the second winding portion is, at its intersection with the first lead portion, connected to a bridge located on the second conductive pattern layer through a via, the first shielding ring is, at its intersection with the first lead portion, connected to the bridge on the second conductive pattern layer through a via, the second shielding ring is, at its intersection with the first lead portion, connected to the bridge on the second conductive pattern layer through a via, and the second shielding ring is, at its intersection with the second lead portion, connected to the bridge on the second conductive pattern layer through a via.

In some embodiments, the touch layer further comprises: the third shielding ring located on one side of the first shielding ring close to the opening and insulated from the first bridging wire and the second bridging wire, the first winding portion being located between the third shielding ring and the first shielding ring; and the third shielding ring has a double-layer structure separated by the insulating pattern layer.

In some embodiments, the display layer comprises a plurality of organic light-emitting diodes arranged in an array; and the first touch electrode and the second touch electrode each are a transparent electrode.

In some embodiments, the display layer comprises a plurality of organic light-emitting diodes arranged in an array; and the first touch electrode is a first metal mesh electrode, the second touch electrode is a second metal mesh electrode, and a light-transmitting hole of the first metal mesh electrode and the second metal mesh electrode coincides with an orthographic projection of the organic light-emitting diode on the base substrate.

In some embodiments, the first lead portion is connected to a plurality of metal meshes at an edge of the first metal mesh electrode, and the second lead portion is connected to a plurality of metal meshes at an edge of the second metal mesh electrode.

In some embodiments, the first lead portion is in a U-shaped connection with the first winding portion, and a section of the first lead portion opposite to the first winding portion is connected to the plurality of metal meshes at the edge of the first metal mesh electrode; and the second lead portion is in a U-shaped connection with the second winding portion, and a section of the second lead portion opposite to the second winding portion is connected to the plurality of metal meshes at the edge of the second metal mesh electrode.

In some embodiments, a line width ratio of each of the first lead portion and the second lead portion to the metal mesh is greater than or equal to 1.7 and less than or equal to 2.3, and a line width ratio of each of the first winding portion and the second winding portion to the metal mesh is greater than or equal to 4 and less than or equal to 5.

In some embodiments, a shape of the opening comprises a circle, a square, an oval, or a rounded rectangle.

In some embodiments, an area of the opening is not less than that of the first touch electrode or the second touch electrode.

In some embodiments, the base substrate is a flexible substrate.

According to another aspect of the embodiments of the present disclosure, there is provided a touch display device comprising: the touch display substrate according to any of the foregoing embodiments, and a functional module arranged at the opening of the touch display substrate.

In some embodiments, the functional module comprises a camera, a distance sensor, a flash, or a speaker.

BRIEF DESCRIPTION OF THE DRAWINGS

The accompanying drawings, which constitute a part of this specification, illustrate embodiments of the present disclosure and, together with the specification, serve to explain the principles of the present disclosure.

The present disclosure may be more clearly understood from the following detailed description made in conjunction with the accompanying drawings, in which.

It should be understood that sizes of various parts shown in the accompanying drawings are not necessarily drawn to actual scales. Furthermore, identical or similar reference numerals denote identical or similar components.

DETAILED DESCRIPTION

Various exemplary embodiments of the present disclosure will now be described in detail with reference to the accompanying drawings. The description of the exemplary embodiments is merely illustrative and is in no way intended to limit the present disclosure, its application, or uses. The present disclosure can be implemented in many different forms and is not limited to the embodiments described herein. These embodiments are provided to make this disclosure thorough and complete, and fully convey the scope of this disclosure to those skilled in the art. It should be noted that: relative arrangement of components and steps, composition of materials, numerical expressions and numerical values set forth in these embodiments are to be construed to be merely illustrative, instead of restrictive, unless specifically stated otherwise.

The words "first," "second," and the like used in this disclosure is not intended to indicate any sequence, number, or importance, but rather is used to distinguish different parts. The word "comprising" or "including", or the like, means that an element preceding the word covers listed elements following the word, and does not preclude the possibility that other elements may also be covered. "Up", "down", and the like are used only to indicate relative position relations, and when an absolute position of an described object changes, the relative position relations may also change correspondingly.

In the present disclosure, when it is described that a specific device is located between a first device and a second device, there may or may not be an intervening device between the specific device and the first device or the second device. When it is described that a specific device is connected to another device, the specific device may be directly connected to the other device without an intervening device, or may be indirectly connected to the other device with an intervening device.

All terms (including technical or scientific terms) used herein have the same meanings as those commonly understood by one of ordinary skill in the art to which this disclosure belongs unless specifically defined otherwise. It will be further understood that terms defined in, e.g., common dictionaries, should be interpreted as having meanings consistent with their meanings in the context of the related art and will not be interpreted in an idealized or extremely formalized meanings unless expressly defined herein.

Techniques, methods, and apparatus known to one of ordinary skill in the related art may not be discussed in detail but are intended to be regarded as a part of the specification where appropriate.

A touch display device works as follows: when a touchable area of the touch display device is touched by a finger, mutual capacitance of driving touch wires and detecting touch wires insulated from and intersecting with one another at the touch points will change. The driving touch wires are scanned one by one, and a signal of each detecting touch wire is read while one driving touch wire is scanned. Through a round of scan, coordinates of the touch points can be determined, and what corresponds to the touch operation will be displayed based on the coordinates of the touch points.

As for a touch display device in the related art, in order to seek for a higher screen occupation ratio (i.e., an area ratio of the display area of the screen to a front surface of the display device), the camera and the distance sensor are arranged in the display area of the screen, and correspondingly, the touch display substrate of the touch display device is provided with an opening for avoiding collision with the camera and the distance sensor. Due to the existence of the opening, touch wires located on both sides of the opening on the touch display substrate cannot continuously transmit a signal, and need to be respectively connected to related circuits, which may cause signal delay, thereby affecting touch sensitivity around the opening.

To solve the above technical problems, the embodiments of the present disclosure provide a touch display substrate and a touch display device. In the following embodiments of the present disclosure, "connection" refers to electrical connection.

Figure 1:
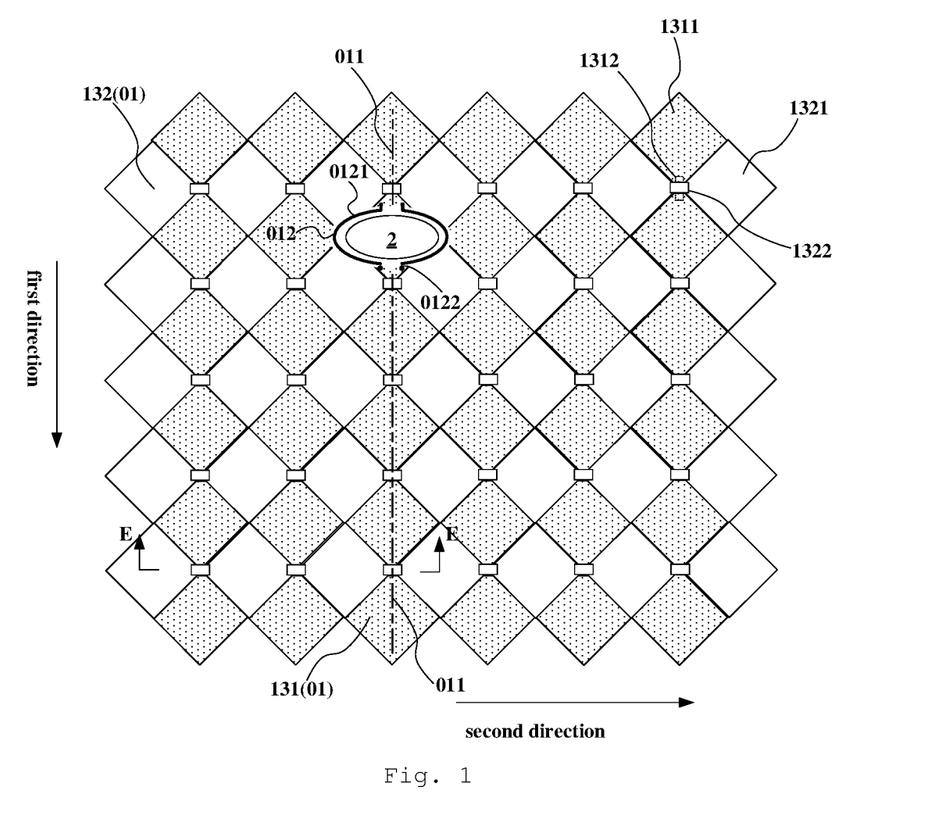
FIG. 1 is a schematic partial top view of a touch display substrate according to an embodiment of the present disclosure.
Figure 2:
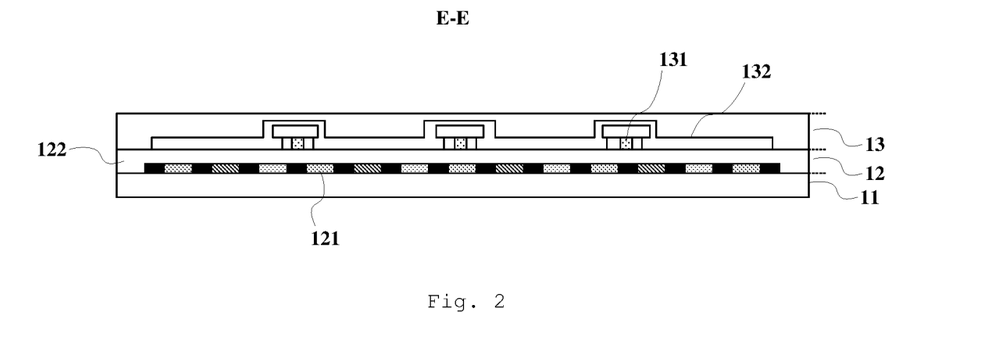
FIG. 2 is a schematic cross-sectional view at E-E of FIG. 1.

FIGS. 1 and 2 show a touch display substrate according to an embodiment of the present disclosure. The touch display substrate has an opening 2. The touch display substrate comprises: a base substrate 11, a display layer 12 on one side of the base substrate 11, and a touch layer 13 on one side of the display layer 12 away from the base substrate 11, wherein the touch layer 13 comprises a network of a plurality of touch wires 01 insulated from and intersecting with one another, and the plurality of touch wires 01 comprise:

a first touch wire 131 extending in a first direction, the first touch wire 131 comprising a plurality of first touch electrodes 1311 arranged in the first direction and first connection portions 1312 connecting adjacent ones of the first touch electrodes 1311; and a second touch wire 132 extending in a second direction, the second touch wire 132 comprising a plurality of second touch electrodes 1321 arranged in the second direction and second connection portions 1322 connecting adjacent ones of the second touch electrodes 1321, the second connection portions 1322 and the first connection portions 1312 being insulated from and intersecting with one another;

wherein at least one touch wire 01 comprises: two wire segments 011 separated by the opening 2 (they are schematically simplified as dashed wires in the figure), and at least one bridging wire 012 connecting the two wire segments 011, the bridging wire 012 comprising a winding portion 0121 arranged around an edge of the opening 2, and two lead portions 0122 arranged at both ends of the winding portion 0121.

In some embodiments of the present disclosure, the bridging wires connecting the two wire segments separated by the opening are at least two and distributed on both sides of the opening. In the embodiment shown in FIG. 1, the bridging wires 012 connecting the two wire segments 011 separated by the opening 2 are two and respectively located at both sides of the opening 2.

In the embodiment of the present disclosure, the first touch wire 131 can be a driving touch wire connected to a driving circuit, and the second touch wire 132 is a detecting touch wire connected to a detecting circuit. Alternatively, the first touch wire 131 is a detecting touch wire connected to a detecting circuit, and the second touch wire 132 is a driving touch wire connected to a driving circuit. Shapes of the first touch electrode 1311 and the second touch electrode 1321 are not limited, for example, complete first touch electrode 1311 and second touch electrode 1321 substantially can be in a diamond shape as shown in the figure, and the area of the first touch electrode 1311 is substantially equal to the area of the second touch electrode 1321.

The opening 2 of the touch display substrate can be used for accommodating functional modules such as a camera, a distance sensor, a flash or a loudspeaker. A shape of the opening 2 may vary depending on a specific type of the functional module. The shape of the opening 2 can be an ellipse as shown in FIG. 1, and furthermore, it can be a circle, a square, a rounded rectangle, or the like. A size of the opening is related to the specification of the functional module, and it is generally not less than an area of one touch electrode. In addition, the number of the openings 2 is not limited, and it can be one, two or more, which is related to the number of the functional modules that need to be arranged on the front panel of the touch display device.

In some embodiments, as shown in FIG. 1, the shape of the opening 2 is an oval, wherein one of the first touch wires 131 adopts the above winding structure design at the opening 2.

In this embodiment, the two bridging wires 012 connect the two wire segments 011 separated by the opening 2 in the first direction, that is, the two wire segments 011 separated by the opening 2 are electrically connected through the two bridging wires 012, and thus, can be connected to a same driving circuit or detecting circuit, thereby reducing signal delay and improving touch sensitivity of the touch display device around the opening 2.

Figure 3:
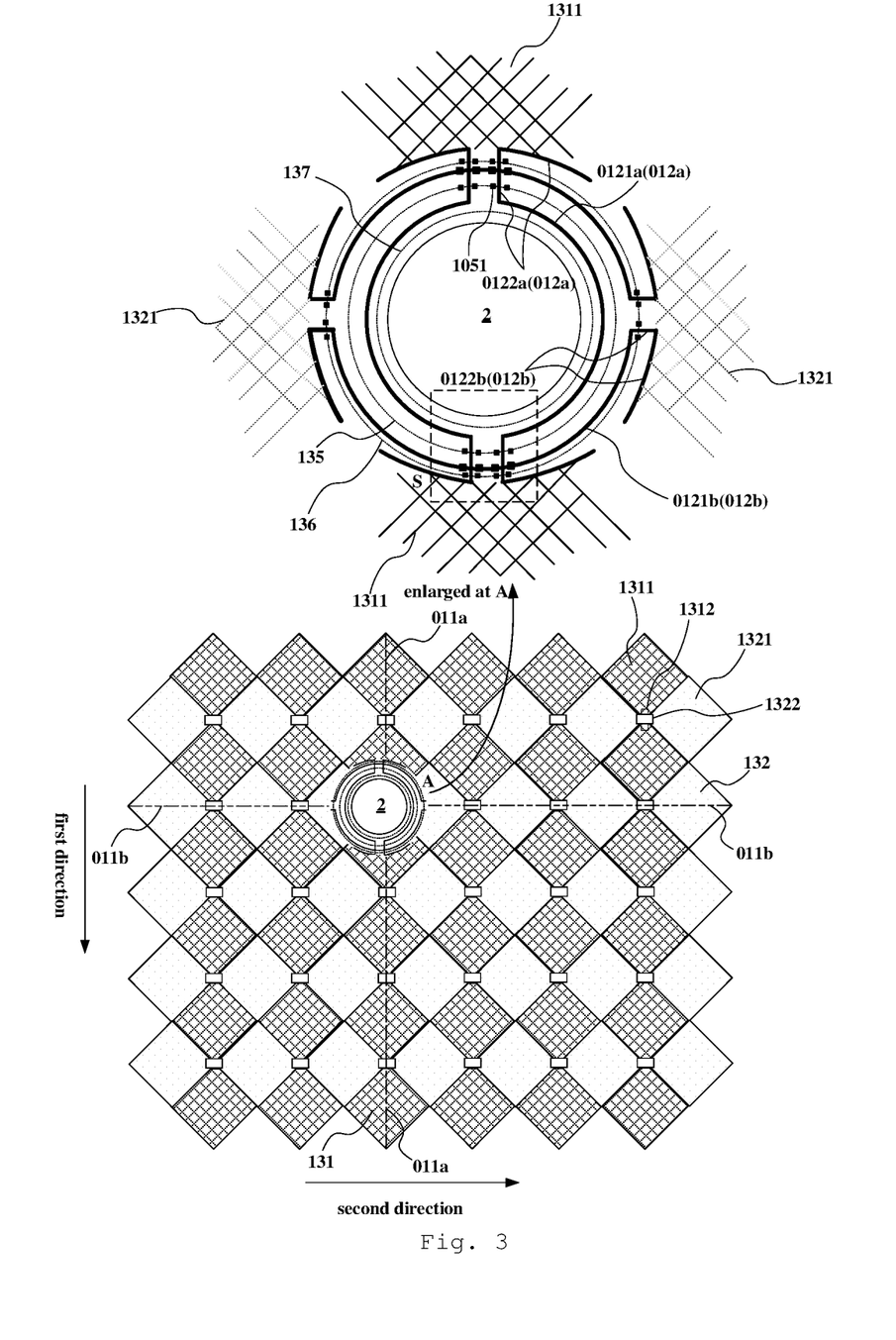
FIG. 3 is a schematic partial top view of a touch display substrate according to another embodiment of the present disclosure.

Referring to FIG. 3, in the touch display substrate according to some embodiments of the present disclosure, at least one first touch wire 131 comprises: two first wire segments 011*a* separated by the opening 2 (they are schematically simplified as dashed wires in the figure), and at least one first bridging wire 012*a* connecting the two first wire segments 011*a*, the first bridging wire 012*a* comprising a first winding portion 0121*a* arranged around the edge of the opening 2 and two first lead portions 0122*a* arranged at both ends of the first winding portion 0121*a*; and at least one second touch wire 132 comprises: two second wire segments 011*b* separated by the opening 2 (they are schematically simplified as dashed wires in the figure), and at least one second bridging wire 012*b* connecting the two second wire segments 011*b*, the second bridging wire 012b comprising a second winding portion 0121b arranged around the edge of the opening 2 and two second lead portions 0122b arranged at both ends of the second winding portion 0121b, wherein the second winding portion 0121b is located on one side of the first winding portion 0121a away from the opening 2.

In the embodiment shown in FIG. 3, the shape of the opening 2 is circular, and one first touch wire 131 and one second touch wire 132 adopt the winding structure design at the opening 2.

Similarly to the foregoing embodiment, the two first wire segments 011a separated by the opening 2 are electrically connected through the two first bridging wires 012a, and the two second wire segments 011b separated by the opening 2 are electrically connected through the two first bridging wires 012b, thereby ensuring the continuity of signal transmission. Compared with the related art, the solution of this embodiment can effectively reduce signal delay and improve touch sensitivity of the touch display device around the opening 2.

Since it is necessary to design correspondingly a position of the opening 2 according to a position where the functional module is arranged, a section of the first touch wire 131 adjacent to the opening 2 may be the first touch electrode 1311 in a complete or incomplete shape, and may also be the first connection portion 1312 in a complete or incomplete shape, and a section of the second touch wire 132 adjacent to the opening 2 may be the second touch electrode 1321 in a complete or incomplete shape, and may also be the second connection portion 1322 in a complete or incomplete shape. For example, in some embodiments, the two first touch electrodes separated by the opening in the first direction are not in a complete diamond shape, and their shapes are not exactly the same, and their areas are not the same.

Figure 4:
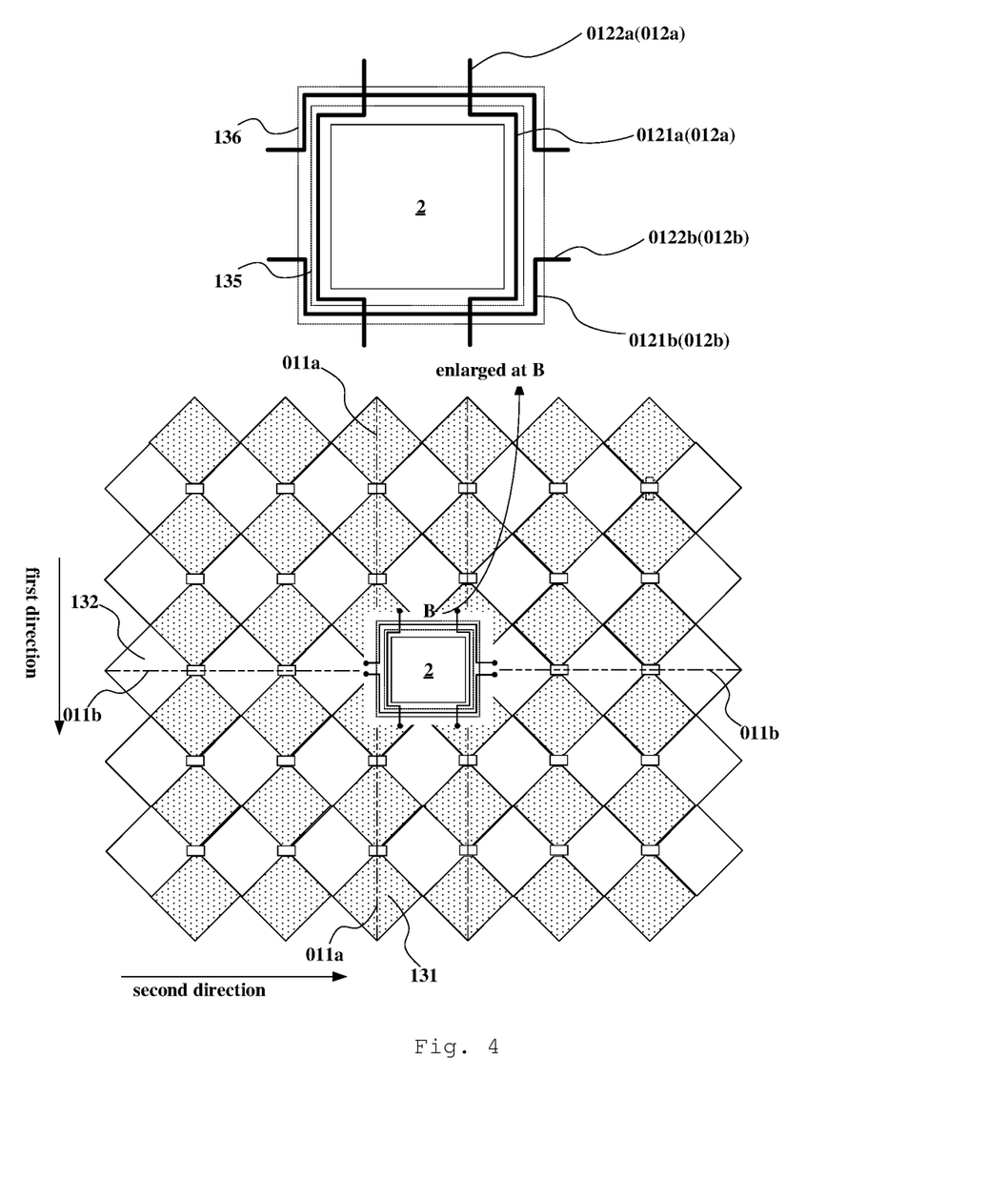
FIG. 4 is a schematic partial top view of a touch display substrate according to still another embodiment of the present disclosure.

As shown in FIG. 4, instill another embodiment of the present disclosure, the shape of the opening 2 is a square, and two first touch wires 131 and one second touch wire 132 adopt the winding structure design at the opening 2. In the vicinity of the opening 2, the first bridging wires 012a are two in number and are respectively located on left and right sides of the opening 2; the second bridging wires 012b are two in number and are respectively located on upper and lower sides of the opening 2, and the two second bridging wires 012b are insulated from and intersecting with the two first bridging wires 012a.

Figure 5:
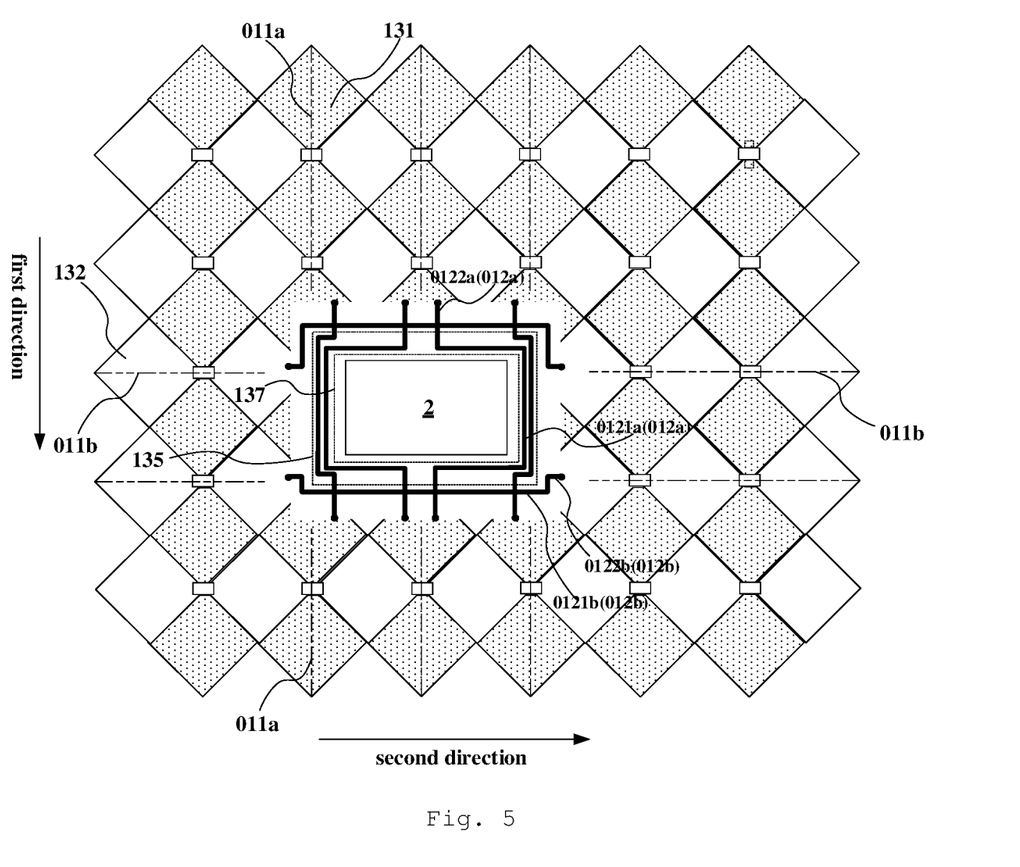
FIG. 5 is a schematic partial top view of a touch display substrate according to a further embodiment of the present disclosure.

As shown in FIG. 5, in a further embodiment of the present disclosure, the shape of the opening 2 is a square, and three first touch wires 131 and two second touch wires 132 adopt the winding structure design at the opening 2. In the vicinity of the opening 2, the first bridging wires 012a are four in number and are evenly distributed on left and right sides of the opening 2; the second bridging wires 012b are two in number and are respectively located on upper and lower sides of the opening 2, and the two second bridging wires 012b are insulated from and intersecting with the four first bridging wires 012a.

The number of the first bridging wires 012a and the second bridging wires 012b which are located around the opening 2, can be designed according to requirements on resistances of the first touch wires 131 and the second touch wires 132, so that mutual capacitances in the touch display substrate are relatively uniform when not being touched, thereby improving accuracy of touch detection.

As shown in FIGS. 3 and 4, in some embodiments of the present disclosure, the touch layer further comprises: a first shielding ring 135 and a second shielding ring 136 which are arranged in sequence in the direction away from the opening 2 and are insulated from the first bridging wires 012a and the second bridging wires 012b, the first winding portion 0121a being located on one side of the first shielding ring 135 away from the second shielding ring 136, the second winding portion 0121b being located between the first shielding ring 135 and the second shielding ring 136. The arrangement of the first shielding ring 135 can effectively reduce signal interference between the first bridging wires 012a and the second bridging wires 012b. The arrangement of the second shielding ring 136 can effectively reduce signal interference between the second bridging wire 012b and the nearby first touch wire 131.

As shown in FIG. 3, in some embodiments of the present disclosure, the touch layer is further provided with a third shielding ring 137, the third shielding ring 137 being located on one side of the first shielding ring 135 close to the opening 2 and insulated from the first bridging wire 012a and the second bridging wire 012b, the first winding portion 0121a being located between the first shielding ring 135 and the third shielding ring 137. The arrangement of the third shielding ring 137 can effectively reduce signal interference caused by the functional module (not shown in the figure) arranged in the opening 2 to the first bridging wire 012a and the second bridging wire 012b.

As shown in FIG. 5, in some embodiments of the present disclosure, the touch layer comprises two shielding rings, which are respectively the above first shielding ring 135 and third shielding ring 137, and in this embodiment, the touch layer is not provided with the second shielding ring 136 as described above.

The above embodiments provided with the shielding rings are all more favorable for improving accuracy of touch detection around the opening 2, thereby improving touch sensitivity.

Figure 6A:
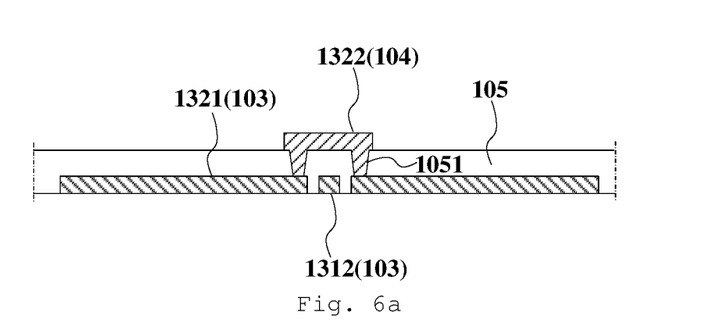
FIG. 6a is a schematic cross-sectional view of a connection between a second touch electrode and a second connection portion in a touch display substrate according to an embodiment of the present disclosure.

In the embodiments of the present disclosure, as shown in FIG. 6a, the touch layer comprises a first conductive pattern layer 103, a second conductive pattern layer 104, and an insulating pattern layer 105 located between the first conductive pattern layer 103 and the second conductive pattern layer 104. The first conductive pattern layer 103 can be located on one side of the second conductive pattern layer 104 closer to the base, and in addition, it can also be located on one side of the second conductive pattern layer 104 farther away from the base.

In an embodiment, the touch layer comprises the first shielding ring 135 and the second shielding ring 136, the first touch electrode 1311, the second touch electrode 1321, the first connection portion 1312, the first bridging wire 012a, sections of the second bridging wire 012b that are not intersected and overlapped with the first bridging wire 012a, sections of the first shielding ring 135 that are not intersected and overlapped with the first bridging wire 012a, and sections of the second shielding ring 136 that are not intersected and overlapped with the first bridging wire 012a and the second bridging wire 012b, which are all located on the first conductive pattern layer 103; and the second connection portion 1322, sections of the second bridging wires 012b that are intersected and overlapped with the first bridging wire 012a, sections of the first shielding ring 135 that are intersected and overlapped with the first bridging wire 012a, and sections of the second shielding ring 136 that are intersected and overlapped with the first bridging wire 012a and the second bridging wire 012b, which are all located on the second conductive pattern layer 104. If the touch layer further comprises the above third shielding ring 137, the third shielding ring 137 can also be arranged on the first conductive pattern layer 103.

In another embodiment, the touch layer comprises the first shielding ring 135, the second shielding ring 136 and the third shielding ring 137, the first touch electrode 1311, the second touch electrode 1321, the first connection portion 1312, the first winding portion 0121*a*, the second winding portion 0121*b*, the first shielding ring 135, the second shielding ring 136 and the third shielding ring 137, which are all located on the first conductive pattern layer 103; and the second connection portion 1322, the first lead portion 0122*a*, and the second lead portion 0122*b*, which are located on the second conductive pattern layer 104.

In still another embodiment, the touch layer comprises the first shielding ring 135, the second shielding ring 136 and the third shielding ring 137, the first touch electrode 1311, the second touch electrode 1321, the first connection portion 1312, the first lead portion 0122*a* and the second lead portion 0122*b*, which are located on the first conductive pattern layer 103; and the second connection portion 1322, the first winding portion 0121*a*, the second winding portion 0121*b*, the first shielding ring 135, the second shielding ring 136, and the third shielding ring 137, which are located on the second conductive pattern layer 104.

In some embodiments of the present disclosure, as shown in FIG. 6*a*, the insulating pattern layer 105 has a via 1051, and structures on the first conductive pattern layer 103 and the second conductive pattern layer 104, which need to be electrically connected, e.g., the second touch electrode 1321 on the first conductive pattern layer 103 and the second connection portion 1322 on the second conductive pattern layer 104, have their electrical connection realized through the via 1051 on the insulating pattern layer 105.

Figure 6B:
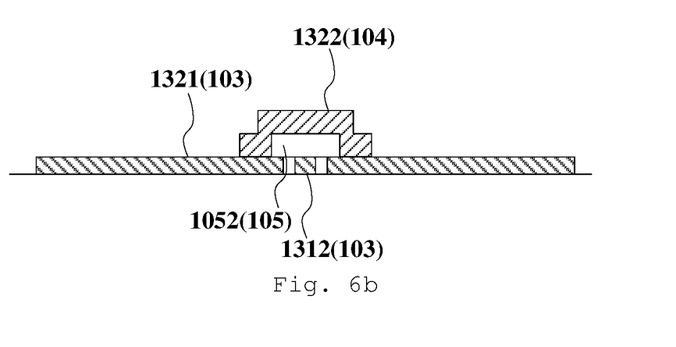
FIG. 6b is a schematic cross-sectional view of a connection between a second touch electrode and a second connection portion in a touch display substrate according to another embodiment of the present disclosure.

In other embodiments of the present disclosure, as shown in FIG. 6*b*, the insulating pattern layer 105 comprises a plurality of insulation units 1052, and the structures on the first conductive pattern layer 103 and the second conductive pattern layer 104, which need to be electrically connected, e.g., the second touch electrode 1321 on the first conductive pattern layer 103 and the second connection portion 1322 on the second conductive pattern layer 104, have their electrical connection realized by the following design: the second connection portion 1322 extends beyond an edge of the insulation unit 1052, and thus, a part thereof is deposited on and electrically connected to the second touch electrode 1321.

In some embodiments of the present disclosure, the touch display substrate is an organic light-emitting touch display substrate. Please referring to FIG. 2, the display layer 12 comprises a plurality of organic light-emitting diodes 121 arranged in an array, and an encapsulation layer 122 located on one side of the plurality of organic light-emitting diodes 121 away from the base 11. The touch layer 13 is manufactured on one side of the encapsulation layer 122 away from the base 11. The touch display substrate can be an active-driving organic light-emitting touch display substrate, and each organic light-emitting diode 121 thereof is controlled by at least two thin film transistors (not shown in the figure), so that continuous and independent light emission can be realized. In an embodiment, the above first touch electrode 1311 and second touch electrode 1321 each are a transparent electrode. A material employed is, for example, indium tin oxide. In this embodiment, specific structures of the first conductive pattern layer, the second conductive pattern layer and the insulating pattern layer of the touch layer can be designed with reference to any of the embodiments described above, wherein materials of structures located on the same pattern layer are the same, and patterns can be formed by one mask patterning process.

Figure 7:
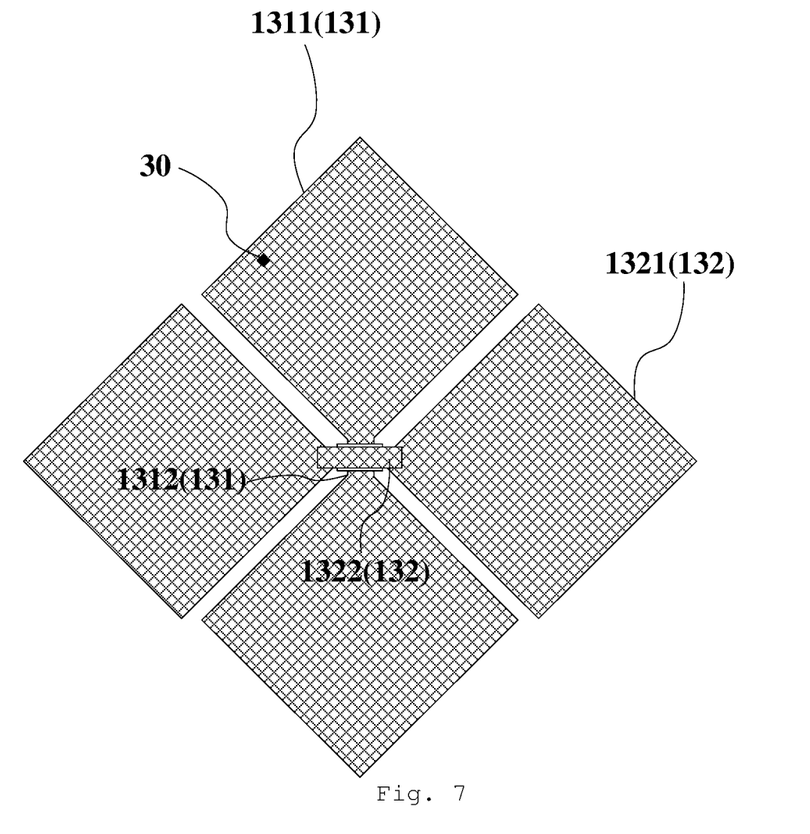
FIG. 7 is a schematic top view of a first touch electrode and a second touch electrode in a touch display substrate according to an embodiment of the present disclosure.

Referring to FIGS. 3 and 7, in another embodiment of the present disclosure, the first touch electrode 1311 is a first metal mesh electrode, the second touch electrode 1321 is a second metal mesh electrode, and a light-transmitting hole of the first metal mesh electrode and the second metal mesh electrode corresponds to an organic light-emitting diode 30 (only one of the organic light-emitting diodes is illustrated in the figure), that is, one light-transmitting hole of the first metal mesh electrode and the second metal mesh electrode corresponds to one sub-pixel, and light emitted by the organic light-emitting diode 30 of each sub-pixel is emitted out through the light-transmitting hole. A material employed by the first metal mesh electrode and the second metal mesh electrode can be titanium/aluminum/titanium, which has lower resistance, better corrosion resistance and lower cost.

As shown in FIG. 3, in this embodiment, the first lead portion 0122*a* is connected to a plurality of metal meshes at an edge of the first metal mesh electrode (the first touch electrode 1311), the first lead portion 0122*a* is connected to the first winding portion 0121*a* in a U-shape, and a section of the first lead portion 0122*a* opposite to the first winding portion 0121*a* is connected to the plurality of metal meshes at the edge of the first metal mesh electrode; and the second lead portion 0122*b* is connected to a plurality of metal meshes at an edge of the second metal mesh electrode (the second touch electrode 1321), the second lead portion 0122*b* is connected to the second winding portion 0121*b* in a U-shape, and a section of the second lead portion 0122*b* opposite to the second winding portion 0121*b* is connected to the plurality of metal meshes at the edge of the second metal mesh electrode. This design can not only ensure a reliable connection between the lead portion and the metal mesh electrode, but also facilitate resistance reduction at the connection.

In some embodiments of the present disclosure, a line width ratio of the first lead portion 0122*a* and the second lead portion 0122*b* to the metal mesh is greater than or equal to 1.7 and less than or equal to 2.3, i.e. the line width of the first lead portion 0122*a* and the second lead portion 0122*b* is 1.7-2.3 times that of the metal mesh; and a line width ratio of the first winding portion 0121*a* and the second winding portion 0121*b* to the metal mesh is greater than or equal to 4 and less than or equal to 5, i.e. the line width of the first winding portion 0121*a* and the second winding portion 0121*b* are 4-5 times that of the metal mesh. The specific line width can be designed according to resistance requirements, so as to ensure reliability of electric connection of the touch wire at the opening and improve accuracy of touch detection.

Referring to FIGS. 3, 8*a*, 8*b* and 8*c*, in an embodiment of the present disclosure, the first touch electrode 1311, the second touch electrode 1321, the first connection portion 1312, the first lead portion 0122*a* and the second lead portion 0122*b* are located on the first conductive pattern layer 103; and the second connection portion 1322 is located on the second conductive pattern layer 104. The first winding portion 0121*a*, the second winding portion 0121*b*, the first shielding ring 135 and the second shielding ring 136 respectively have a double-layer structure (i.e. they respectively comprise a section located on the first conductive pattern layer 103 and a section located on the second conductive pattern layer 104) which is separated by the insulating pattern layer 105, and the second winding portion 0121*b* at its intersection with the first lead portion 0122*a*, the first shielding ring 135 at its intersection with the first lead portion 0122*a*, the second shielding ring 136 at its intersection with the first lead portion 0122*a*, and the second shielding ring 136 at its intersection with the second lead portion 0122b, are respectively connected to a bridge 80 located on the second conductive pattern layer 104 through the via 1051. The touch layer in this embodiment further comprises the third shielding ring 137, and the third shielding ring 137 is not intersected with other structures and has the double-layer structure separated by the insulating pattern layer 105, which is simpler in structure than the first shielding ring 135 and the second shielding ring 136.

Figure 8A:
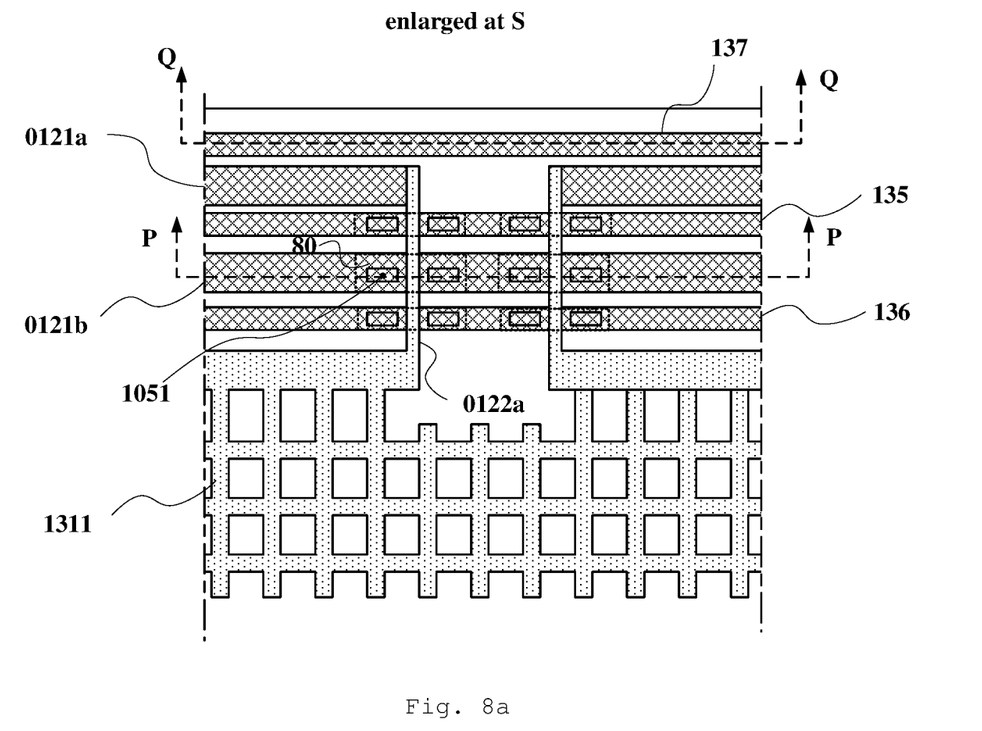
FIG. 8a is an enlarged schematic view at S of FIG. 3 according to an embodiment of the present disclosure.
Figure 8B:
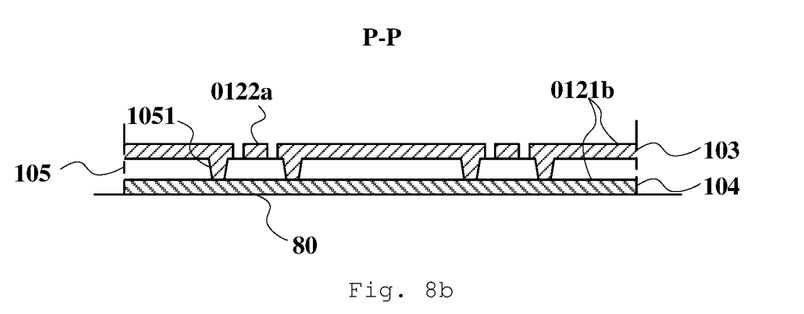
FIG. 8b is a schematic cross-sectional view at P-P of FIG. 8a according to an embodiment of the present disclosure.
Figure 8C:
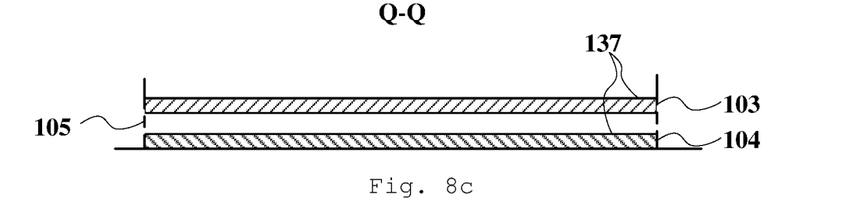
FIG. 8c is a schematic cross-sectional view at Q-Q of FIG. 8a according to an embodiment of the present disclosure.

In this embodiment, the first winding portion 0121a and the second winding portion 0121b adopt the double-layer structure design, which can further improve reliability of signal transmission and does not substantially increase process cost. The first shielding ring 135, the second shielding ring 136 and the third shielding ring 137 adopt the double-layer structure design, which can further improve anti-interference performance of signals, and further enhance touch sensitivity.

In the above embodiments, the base 11 of the organic light-emitting touch display substrate can be a flexible one, so that the touch display substrate can be applied in a curved-screen or flexible-screen product, and its application range is wider.

Figure 9:
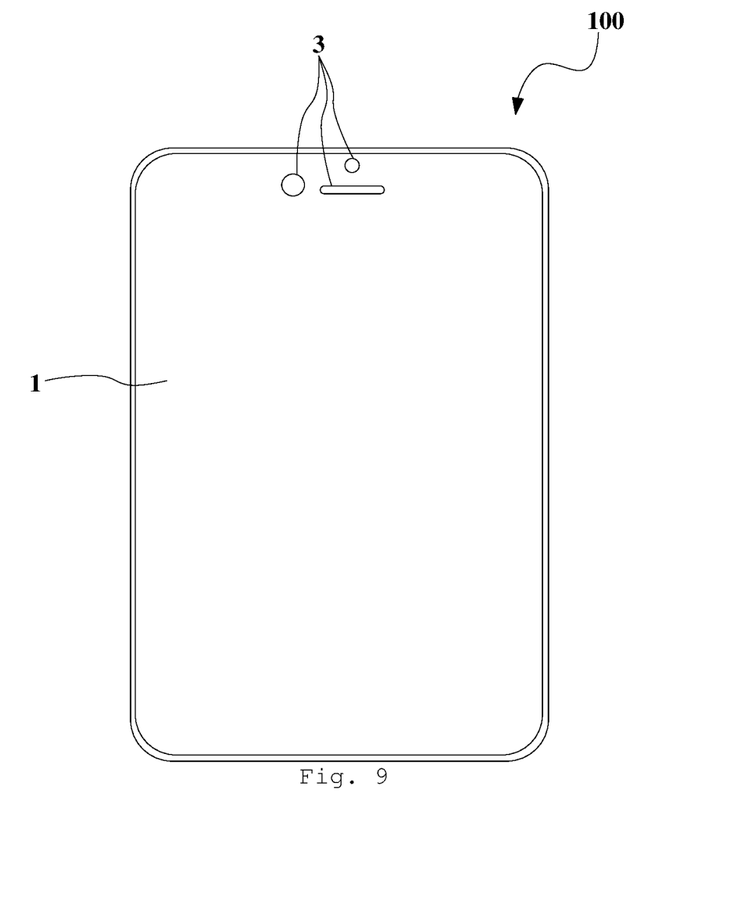
FIG. 9 is a front view of a touch display device according to an embodiment of the present disclosure.

As shown in FIG. 9, the embodiments of the present disclosure further provide a touch display device 100, comprising the touch display substrate 1 employing the structure of any of the foregoing embodiments, and a functional module 3 arranged at the opening of the touch display substrate 1. The touch display device 100 also has a better touch effect around the opening.

A specific type of the functional module 3 herein is not limited, and can be, for example, a camera, a distance sensor, a flash, a speaker, etc. A specific product type of the touch display device 100 is not limited, and can be, for example, a mobile phone, a tablet computer, a smart band, a smart watch, a car navigation system, etc.

Thus far, various embodiments of the present disclosure have been described in detail. Some details well known in the art have not been described in order to avoid obscuring the concepts of the present disclosure. Those skilled in the art can now fully appreciate how to implement the solutions disclosed herein, in view of the foregoing description.

Although some specific embodiments of the present disclosure have been described in detail through examples, it should be understood by those skilled in the art that the above examples are for illustration only and are not intended to limit the scope of the present disclosure. It will be understood by those skilled in the art that modifications to the above embodiments or equivalent substitutions for partial technical features thereof can be made without departing from the scope and spirit of the present disclosure. The scope of the present disclosure is defined by the attached claims.

What is claimed is:

1. A touch display substrate, the touch display substrate having an opening, the touch display substrate comprising:
    a base substrate;
    a display layer located on one side of the base substrate; and
    a touch layer located on one side of the display layer away from the base substrate, the touch layer comprising a plurality of touch wires in a network form, which are insulated from and intersecting with one another, the plurality of touch wires comprising:
        a first touch wire extending in a first direction, the first touch wire comprising a plurality of first touch electrodes arranged in the first direction and a first connection portion connecting adjacent ones of the first touch electrodes;
        a second touch wire extending in a second direction, the second touch wire comprising a plurality of second touch electrodes arranged in the second direction and a second connection portion connecting adjacent ones of the second touch electrodes, the second connection portion and the first connection portion being insulated from and intersecting with one another,
    wherein at least one of the touch wires comprises two wire segments separated by the opening, and at least one bridging wire connecting the two wire segments, the bridging wire comprising a winding portion arranged around an edge of the opening and two lead portions located at both ends of the winding portion; and
    at least one first touch wire comprises two first wire segments separated by the opening, and at least one first bridging wire connecting the two first wire segments, the first bridging wire comprising a first winding portion arranged around the edge of the opening and two first lead portions located at both ends of the first winding portion, and the first lead portion is in a U-shaped connection with the first winding portion.

2. The touch display substrate according to claim 1, wherein the bridging wires connecting the two of the wire segments are at least two and distributed on both sides of the opening.

3. The touch display substrate according to claim 1, wherein: at least one second touch wire comprises two second wire segments separated by the opening, and at least one second bridging wire connecting the two second wire segments, the second bridging wire comprising a second winding portion arranged around the edge of the opening and two second lead portions located at both ends of the second winding portion, wherein the second winding portion is located on one side of the first winding portion away from the opening.

4. The touch display substrate according to claim 3, wherein:
    the touch layer further comprises a first shielding ring and a second shielding ring which are arranged in sequence in a direction away from the opening and are insulated from the first bridging wire and the second bridging wire; and
    the first winding portion is located on one side of the first shielding ring away from the second shielding ring, and the second winding portion is located between the first shielding ring and the second shielding ring.

5. The touch display substrate according to claim 4, wherein:
    the touch layer comprises a first conductive pattern layer, a second conductive pattern layer, and an insulating pattern layer located between the first conductive pattern layer and the second conductive pattern layer;
    the first touch electrode, the second touch electrode, the first connection portion, the first lead portion and the second lead portion are located on the first conductive pattern layer;
    the second connection portion is located on the second conductive pattern layer;
    the first winding portion, the second winding portion, the first shielding ring and the second shielding ring respectively have a double-layer structure separated by the insulating pattern layer, and the second winding portion is, at its intersection with the first lead portion, connected to a bridge located on the second conductive pattern layer through via, the first shielding ring is, at its intersection with the first lead portion, connected to the bridge on the second conductive pattern layer through via, the second shielding ring is, at its intersection with the first lead portion, connected to the bridge on the second conductive pattern layer through via, and the second shielding ring is, at its intersection with the second lead portion, connected to the bridge on the second conductive pattern layer through via.

6. The touch display substrate according to claim 5, wherein:
the touch layer further comprises a third shielding ring located on one side of the first shielding ring close to the opening and insulated from the first bridging wire and the second bridging wire, the first winding portion being located between the third shielding ring and the first shielding ring; and
the third shielding ring has a double-layer structure separated by the insulating pattern layer.

7. The touch display substrate according to claim 3, wherein:
the display layer comprises a plurality of organic light-emitting diodes arranged in an array; and
the first touch electrode is a first metal mesh electrode, the second touch electrode is a second metal mesh electrode, and a light-transmitting hole of the first metal mesh electrode and the second metal mesh electrode coincides with an orthographic projection of the organic light-emitting diode on the base substrate.

8. The touch display substrate according to claim 7, wherein
the first lead portion is connected to a plurality of metal meshes at an edge of the first metal mesh electrode, and the second lead portion is connected to a plurality of metal meshes at an edge of the second metal mesh electrode.

9. The touch display substrate according to claim 8, wherein:
a section of the first lead portion opposite to the first winding portion is connected to the plurality of metal meshes at the edge of the first metal mesh electrode; and
the second lead portion is in a U-shaped connection with the second winding portion, and a section of the second lead portion opposite to the second winding portion is connected to the plurality of metal meshes at the edge of the second metal mesh electrode.

10. The touch display substrate according to claim 8, wherein a line width ratio of each of the first lead portion and the second lead portion to the metal mesh is greater than or equal to 1.7 and less than or equal to 2.3, and a line width ratio of each of the first winding portion and the second winding portion to the metal mesh is greater than or equal to 4 and less than or equal to 5.

11. The touch display substrate according to claim 1, wherein:
the display layer comprises a plurality of organic light-emitting diodes arranged in an array; and
the first touch electrode and the second touch electrode each are a transparent electrode.

12. The touch display substrate according to claim 11, wherein the base substrate is a flexible substrate.

13. The touch display substrate according to claim 1, wherein a shape of the opening comprises a circle, a square, an oval, or a rounded rectangle.

14. The touch display substrate according to claim 1, wherein an area of the opening is not less than that of the first touch electrode or the second touch electrode.

15. A touch display device comprising:
the touch display substrate according to claim 1; and
a functional module arranged at the opening of the touch display substrate.

16. The touch display device according to claim 15, wherein the functional module comprises a camera, a distance sensor, a flash, or a speaker.

17. A touch display substrate, the touch display substrate having an opening, the touch display substrate comprising:
a base substrate;
a display layer located on one side of the base substrate;
a touch layer located on one side of the display layer away from the base substrate, the touch layer comprising a plurality of touch wires in a network form, which are insulated from and intersecting with one another, the plurality of touch wires comprising:
a first touch wire extending in a first direction, the first touch wire comprising a plurality of first touch electrodes arranged in the first direction and a first connection portion connecting adjacent ones of the first touch electrodes;
a second touch wire extending in a second direction, the second touch wire comprising a plurality of second touch electrodes arranged in the second direction and a second connection portion connecting adjacent ones of the second touch electrodes, the second connection portion and the first connection portion being insulated from and intersecting with one another,
wherein at least one of the touch wires comprises two wire segments separated by the opening, and at least one bridging wire connecting the two wire segments, the bridging wire comprising a winding portion arranged around an edge of the opening and two lead portions located at both ends of the winding portion;
wherein at least one first touch wire comprises two first wire segments separated by the opening, and at least one first bridging wire connecting the two first wire segments, the first bridging wire comprising a first winding portion arranged around the edge of the opening and two first lead portions located at both ends of the first winding portion; and
wherein at least one second touch wire comprises two second wire segments separated by the opening, and at least one second bridging wire connecting the two second wire segments, the second bridging wire comprising a second winding portion arranged around the edge of the opening and two second lead portions located at both ends of the second winding portion, wherein the second winding portion is located on one side of the first winding portion away from the opening;
a first shielding ring and a second shielding ring which are arranged in sequence in a direction away from the opening and are insulated from the first bridging wire and the second bridging wire, wherein the first winding portion is located on one side of the first shielding ring away from the second shielding ring, and the second winding portion is located between the first shielding ring and the second shielding ring; and a third shielding ring located on one side of the first shielding ring close to the opening and insulated from the first bridging wire and the second bridging wire, wherein the first winding portion is located between the third shielding ring and the first shielding ring, and the first shielding ring is located between the second shielding ring and the third shielding ring.

* * * * *